United States Patent
Hanrahan

(10) Patent No.: US 11,867,761 B2
(45) Date of Patent: *Jan. 9, 2024

(54) SAFETY FAULT INTERRUPTER CIRCUIT WITH POWER FAULT MONITOR

(71) Applicant: TEXAS INSTRUMENTS INCORPORATED, Dallas, TX (US)

(72) Inventor: Robert Mason Hanrahan, Montvale, NJ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/407,253

(22) Filed: Aug. 20, 2021

(65) Prior Publication Data

US 2021/0382112 A1   Dec. 9, 2021

Related U.S. Application Data

(63) Continuation of application No. 16/189,431, filed on Nov. 13, 2018, now Pat. No. 11,125,820.
(Continued)

(51) Int. Cl.
*H02H 3/16* (2006.01)
*G01R 31/327* (2006.01)
(Continued)

(52) U.S. Cl.
CPC ..... *G01R 31/3274* (2013.01); *G01R 31/3275* (2013.01); *H02H 3/162* (2013.01); *H02H 3/335* (2013.01); *G01R 19/16547* (2013.01)

(58) Field of Classification Search
CPC ........ H02H 3/162; H02H 3/335; H02H 3/336; H02H 3/338; G01R 19/16547; G01R 31/3274; G01R 31/3275
See application file for complete search history.

(56) References Cited

U.S. PATENT DOCUMENTS 6,339,525 B1   1/2002   Neiger et al.
8,879,218 B2   11/2014  Tomimbang
(Continued)

FOREIGN PATENT DOCUMENTS

| CN | 101375478 A | 2/2009 |
| CN | 102694364 A | 9/2012 |
| CN | 105610120 A | 5/2016 |

OTHER PUBLICATIONS

Texas Instruments Incorporated. "Power Supply Supervisory Circuit." SLUS188A-Apr. 1997—Revised Feb. 2007.
(Continued)

*Primary Examiner* — Nguyen Tran
(74) *Attorney, Agent, or Firm* — John R. Pessetto; Frank D. Cimino

(57) ABSTRACT

An apparatus includes a safety fault interrupter circuit. The safety fault interrupter circuit includes a safety fault monitor coupled to a first bias node and configured to selectively assert a fault interrupter signal based at least in part on a first bias voltage and a first power consumption. The safety fault interrupter circuit also includes a power fault monitor for the safety fault monitor, wherein the power fault monitor is coupled to a second bias node and is configured to selectively assert the fault interrupter signal based at least in part on a second bias voltage and a second power consumption that is less than the first power consumption.

14 Claims, 6 Drawing Sheets

Related U.S. Application Data

(60) Provisional application No. 62/662,451, filed on Apr. 25, 2018.

(51) Int. Cl.
*H02H 3/33* (2006.01)
*G01R 19/165* (2006.01)

(56) References Cited

U.S. PATENT DOCUMENTS

| | | |
|---|---|---|
| 9,118,174 B2 | 8/2015 | Simonin |
| 2010/0290164 A1* | 11/2010 | Kinsel .................... H02H 3/331 |
| | | 361/45 |
| 2012/0154972 A1 | 6/2012 | McMahon et al. |
| 2014/0092503 A1 | 4/2014 | Ostrovsky |
| 2014/0278157 A1 | 9/2014 | Simonin |
| 2015/0130477 A1 | 5/2015 | Berland et al. |
| 2016/0334454 A1 | 11/2016 | Lentz et al. |
| 2016/0365718 A1* | 12/2016 | Legatti .................... H02H 3/044 |
| 2018/0278040 A1* | 9/2018 | Hao ........................ H02H 3/162 |
| 2019/0331734 A1 | 10/2019 | Hanrahan |

OTHER PUBLICATIONS

First Office Action issued in corresponding Chinese Patent Application No. CN2019103225349, dated Nov. 18, 2022, 20 pgs.

* cited by examiner

SAFETY FAULT INTERRUPTER CIRCUIT WITH POWER FAULT MONITOR

CROSS-REFERENCE TO RELATED APPLICATIONS

This continuation application claims priority to U.S. patent application Ser. No. 16/189,431, filed Nov. 13, 2018, which application claims priority to U.S. Provisional Application Na 62/662,451, filed Apr. 25, 2018, both of which are hereby incorporated by reference in their entirety.

BACKGROUND

Power supplies and power converters are used in a variety of electronic systems. Electrical power is generally transmitted over long distances as an alternating current (AC) signal. The AC signal is divided and metered as desired for each business or home location, and is often converted to direct current (DC) for use with individual electronic devices or components. Modern electronic systems often employ devices or components designed to operate using different AC or DC voltages.

There are ongoing safety issues related to the electrical grid and fault scenarios that arise due to component failure and/or human error. To account for such scenarios, ongoing standardization and safety organizations have developed safety fault interrupter specifications. One example specification is UL943, which defines the requirements for a ground fault circuit interrupter (GFCI). Another example specification defines the requirements for an arc fault circuit interrupter (AFCI). Such specifications are updated over time as needed, and efforts to provide reliable and cost-effective circuits in compliance with such specifications are ongoing.

One issue that has been identified for some safety fault interrupter circuits is that providing an integrated circuit (IC) bias voltage safely over all conditions requires 2 or 4 large high power shunt resistors to ensure a reliable design, which will continue to operate properly over all UL test conditions. For example, UL943 states that each component "shall be tested by imposing a fault on the component which simulates the typical failure mode for the component". Thus, a voltage dropping resistor must withstand a single open circuit. Also, existing fault detection IC's do not provide a mechanism to detect an external AC-DC circuit fault to ensure de-energization as required by UL943. Efforts to improve safety fault interrupters are ongoing.

SUMMARY

In accordance with at least one example of the disclosure, an apparatus comprises a safety fault interrupter circuit. The safety fault interrupter circuit comprises a safety fault monitor coupled to a first bias node and configured to selectively assert a fault interrupter signal based at least in part on the first bias voltage and a first power consumption. The safety fault interrupter circuit also comprises a power fault monitor for the safety fault monitor. The power fault monitor is coupled to a second bias node and is configured to selectively assert the fault interrupter signal based at least in part on the second bias voltage and a second power consumption that is less than the first power consumption.

In accordance with at least one example of the disclosure, a safety fault interrupter integrated circuit (IC) comprises a safety fault monitor circuit configured to selectively assert a fault interrupter signal. The safety fault interrupter IC also comprises a power fault monitor circuit for the safety fault monitor circuit, wherein the power fault monitor circuit is configured to selectively assert the fault interrupter signal. The power fault monitor circuit comprises a voltage sense circuit configured to compare a first voltage input to the safety fault monitor circuit and a second voltage input to the power fault monitor circuit, and to determine a comparison result. The power fault monitor circuit also comprises a switch operated based on the comparison result.

In accordance with at least one example of the disclosure, an IC comprises a first node configured to receive a first voltage. The IC also comprises a second node configured to receive a second voltage. The IC also comprises a safety fault monitor circuit configured to selectively assert a fault interrupter signal based at least in part on a first voltage, wherein the safety fault monitor circuit has a first power consumption. The IC also comprises a power fault monitor circuit for the safety fault monitor circuit. The power fault monitor circuit is configured to selectively assert the fault interrupter signal based at least in part on a comparison of the first voltage and the second voltage, wherein the power fault monitor circuit has a second power consumption that is less than the first power consumption.

BRIEF DESCRIPTION OF THE DRAWINGS

For a detailed description of various examples, reference will now be made to the accompanying drawings in which.

DETAILED DESCRIPTION

Figure 1:
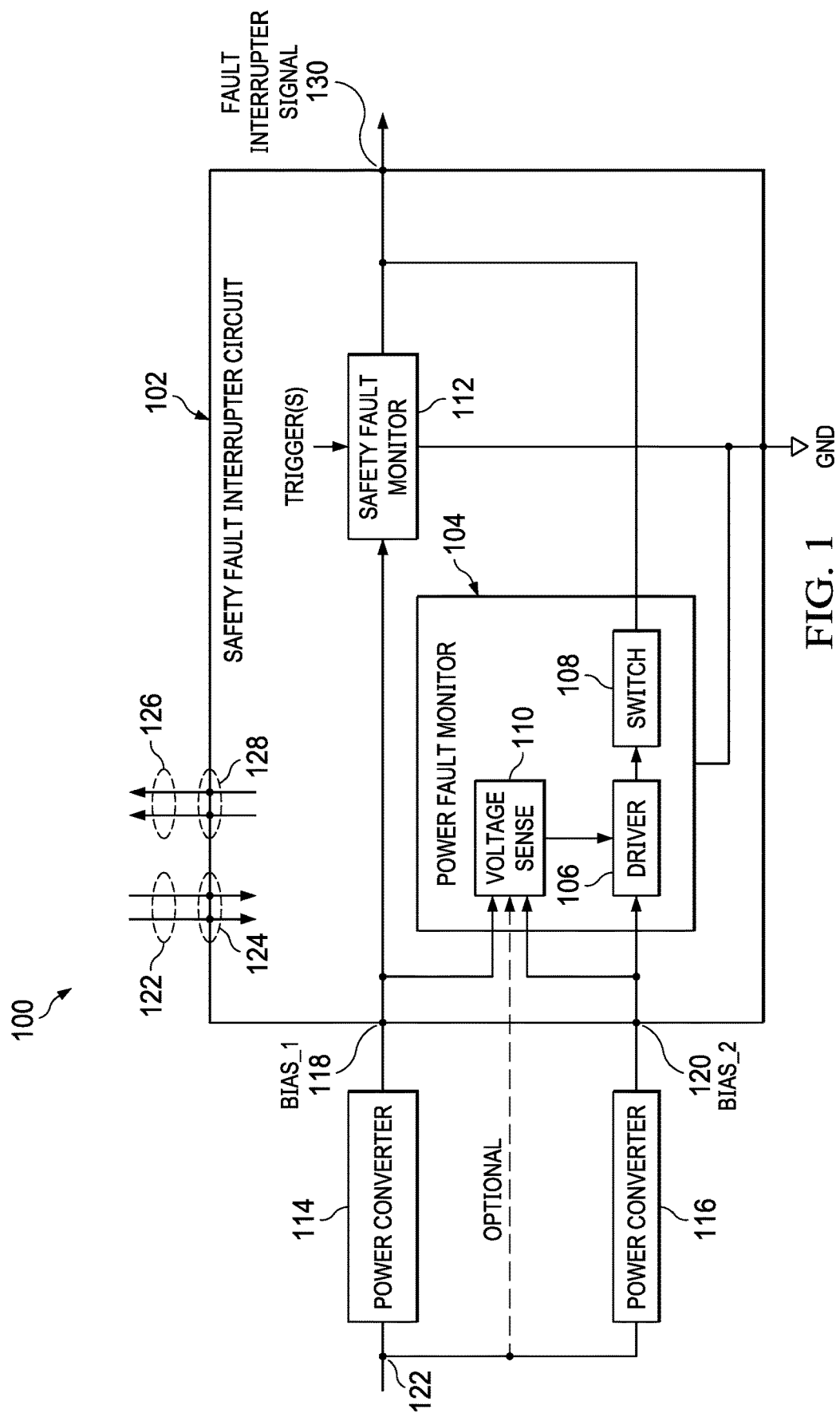
FIG. 1 shows a block diagram of a system with a safety fault interrupter circuit in accordance with various examples.

Disclosed herein are safety fault interrupter circuits having a safety fault monitor and a power fault monitor for the safety fault monitor. Example safety fault monitors are configured to detect ground faults or arc faults. In either case, each of the safety fault monitor and the power fault monitor is able to assert the same fault interrupter signal. Without limitation, in some examples, the disclosed safety fault interrupter circuits are manufactured as monolithic integrated circuits (ICs) or as multi-die modules. In at least some examples, the safety fault monitor and the power fault monitor of a safety fault interrupter circuit are designed for use with different bias voltages and/or have different power consumptions. As used herein, "a bias voltage" is a direct current (DC) voltage (e.g., derived from an AC power line) that enables proper operation of a circuit or sub-circuit.

An example safety fault interrupter circuit includes a safety fault monitor configured to selectively assert a fault interrupter signal based at least in part on a first bias voltage and a first power consumption. As an example, the safety fault monitor uses the first bias voltage at least to power sensing and switching operations with the first power consumption, where the safety fault monitor acts in response to a fault trigger (e.g., ground fault trigger or arc fault trigger). As an example, in a ground fault circuit interrupter (GFCI) scenario, a fault trigger occurs when an unequal opposite current of defined maximum amplitude is sensed across the hot (Live) to neutral (return) wires of an AC power line, where the fault is indicative of a possible human electrocution from hot to earth ground. As another example, in an arc fault circuit interrupter (AFCI) scenario, a fault trigger occurs when current and voltage sense signals along a cable are determined to have an arc signature. Regardless of the type of safety fault to be detected, the first bias voltage is used to power internal IC circuitry including, but not limited to, any combination of sensing circuits, signal conditioning circuits, monitoring circuits, and/or power deactivation circuits.

An example safety fault interrupter circuit also includes a power fault monitor for the safety fault monitor, where the power fault monitor is configured to selectively assert the fault interrupter signal based at least in part on a second bias voltage and a second power consumption that is less than the first power consumption. As an example, the power fault monitor uses the second bias voltage at least to power switching operations in response to one or more power fault triggers. In some examples, the power fault trigger circuit is a simple and low power circuit compared to the safety fault monitor.

In some examples, the second bias voltage has a no power-fault magnitude that is less than a no power-fault magnitude of the first bias voltage level. As used herein, "no power-fault magnitude" refers to a voltage level during a normal monitoring state of the safety fault interrupter circuit (before a power loss fault occurs). In other examples, the no power-fault magnitude of the first bias voltage level is the same or is less than the second bias voltage level. Regardless of the particular no power-fault magnitudes for the first and second bias voltage levels, under normal power loss conditions, the first bias voltage level is expected to drop faster than the second bias voltage level in the event of a power loss fault. In a converse example, under normal energizing conditions, the second bias voltage is expected to rise faster than the first bias level. In different examples, there are different types of faults that the safety fault interrupter circuit is able to respond to. In some examples, the safety fault monitor asserts the fault interrupter signal in response to a ground fault condition. In other examples, the safety fault monitor asserts the fault interrupter signal in response to an arc fault condition. Meanwhile, the power fault monitor asserts the fault interrupter signal in response a fault in the power supply providing the first bias voltage. Such power faults are detected, in some examples, by comparing the magnitudes of the first and second bias voltages.

In some examples, the power fault monitor includes a voltage sense circuit configured to compare the first bias voltage input to the safety fault monitor with the second bias voltage input to the power fault monitor. Based on the comparison results, the power fault monitor asserts the fault interrupter signal. In some examples, the power fault monitor asserts the fault interrupter signal when the comparison result indicates that a drop rate of the first bias voltage relative to a drop rate of the second bias voltage exceeds a threshold. In some examples, the power fault monitor asserts the fault interrupter signal when the comparison result indicates that the difference between the first and second bias voltages is more than a threshold amount. To provide a better understanding, various safety fault interrupter circuit options, fault monitor options, and fault response options are described using the figures as follows.

FIG. 1 shows a block diagram of a system 100 with a safety fault interrupter circuit 102 in accordance with various examples. In some examples, the safety fault interrupter circuit 102 is an IC compatible with GFCI, AFCI, and/or other fault standards. As shown, the system 100 comprises the safety fault interrupter circuit 102, which is coupled to a first power converter 114 configured to provide a first bias voltage (BIAS_1) at node 118 of the safety fault interrupter circuit 102. In some examples, the first power converter 114 comprises at least one diode, a resistor, and a capacitor arranged to rectify and convert an input voltage available at node 122 to BIAS_1. In other examples, the first power converter 114 comprises a switched-mode power supply (SMPS) configured to convert an input voltage available at node 122 to BIAS_1.

As shown in FIG. 1, the system 100 also comprises a second power converter 116 configured to provide a second bias voltage (BIAS_2) at node 120 of the safety fault interrupter circuit 102. In some examples, the second power converter 116 comprises at least one diode, a resistor, and a capacitor to provide BIAS_2 at node 120 of the safety fault interrupter circuit 102. In different examples, the no power-fault magnitudes for BIAS_1 and BIAS_2 vary depending on the respective circuits used with the safety fault monitor 112 and the power fault monitor 104. In different examples, the no power-fault magnitude for BIAS_1 is greater than, equal to, or less than the no power-fault value for BIAS_2 (e.g., the no power-fault values for BIAS_1 and BIAS_2 are between 5-20 Volts, where BIAS_1 and BIAS_2 are selected depending on a specific IC implementation).

In some examples, the second power converter 116 and the first power converter 114 share one or more diodes. Also, in some examples, a resistor value for the second power converter 116 is higher than a resistor value for the first power converter 114 (e.g., 20-30 times higher). In one example, a resistor value for the second power converter 116 is 750 kΩ while a resistor value for the first power converter 114 is 27 kΩ. Also, in some examples, a capacitor value for the second power converter 116 is equal to or less than a capacitor value for the first power converter 114.

In operation, the safety fault interrupter circuit 102 detects and responds to faults using a safety fault monitor 112 and a power fault monitor 104. In at least some examples, the safety fault monitor 112 selectively asserts a fault interrupter signal to node 130 of the safety fault interrupter circuit 102 based on one or more triggers, where BIAS_1 is at least used to power switching operations of the safety fault monitor 112 (to assert the fault interrupter signal). In different examples, different triggers for the safety fault monitor 112 are based on one or more signals 122 received at input nodes 124 of the safety fault interrupter circuit 102. Also, as desired, the safety fault interrupter circuit 102 provides one or more input/output signals 122/126 via input/output nodes 124/128. In an example GFCI scenario, the safety fault monitor 112 senses differential current to and from an AC load. In an example AFCI scenario, the safety fault monitor 112 senses a current/voltage arc signature along a cable coupled to an AC load.

Meanwhile, the power fault monitor 104 selectively asserts the fault interrupter signal to node 130 of the safety fault interrupter circuit 102 based on one or more other triggers, where BIAS_2 is at least used to power switching operations of the power fault monitor 104 (to assert the fault interrupter signal). In at least some examples, the power fault monitor 104 detects and responds to a BIAS_1 power converter fault based on a comparison of BIAS_1 and BIAS_2, where the comparison results is used as a trigger to assert the fault interrupter signal. In one example, the power fault monitor 104 asserts the fault interrupter signal when the comparison result indicates that a drop rate of BIAS_1 relative to a drop rate of BIAS_2 voltage exceeds a threshold. In another example, the power fault monitor 104 asserts the fault interrupter signal when the comparison result indicates that BIAS_1 varies from or is less than BIAS_2 by more than a threshold amount. In any of these test conditions the input voltage 122 may be conditioned (rectified and/or reduced) and optionally used as an additional trigger/threshold level for the comparison of BIAS_1 and/or BIAS_2.

As an example fault, if power is lost at node 122, the value of BIAS_1 at node 118 will drop below a predetermined voltage threshold within a predetermined time (on the order of milliseconds) before the value of BIAS_2 at node 120 is affected by the power loss at node 122. If a fault condition is determined to exist within power converter 114 or elsewhere related to a failure of the IC's primary fault monitor 112 or any associated external circuitry, this delayed loss of power at the power fault monitor 104 enables assertion of the fault interrupter signal at node 130 even if the majority of the IC circuitry corresponding to the safety fault interrupter circuit 102 (including the safety fault monitor 112) has already been de-energized. In some examples, the power fault monitor 104 and the second power converter 116 employs components that are small and efficient such that BIAS_2 is stored longer than BIAS_1 in response to a power loss fault within or associated with power converter 114. Thus, in one example, the power fault monitor 104 asserts the fault interrupter signal when a comparison result indicates that a drop rate of BIAS_1 relative to a drop rate of BIAS_2 voltage exceeds a threshold. In another example, the power fault monitor 104 asserts the fault interrupter signal when a comparison result indicates that BIAS_1 varies from or is less than BIAS_2 by more than a threshold amount. In at least some examples, the input voltage at node 122 is used as a qualifier or trigger during the fault determination process.

In some examples, the power fault monitor 104 is designed with a sufficiently low power consumption and with storage elements (e.g., capacitors) within or after the second power converter 116, such that the power fault monitor 104 is sufficiently powered to trigger the fault interrupter signal in response to a power loss fault. In one example, the extended "hold-up" power provided through a switch 108 of the power fault monitor 104 lasts on the order of 5 milliseconds after the actual loss of power at node 122, or from a power loss at BIAS_1 occurring as an example by a fault within power converter 114 and/or associated internal or external circuitry.

To perform the comparison of BIAS_1 and BIAS_2 (and optionally the input voltage at node 122), the power fault monitor 104 employs a voltage sense circuit 110. In some examples, the voltage sense circuit 110 comprises one or more resistors, comparators, op-amps, voltage references, gates, flip-flops, and/or other circuit components configured to compare the two bias voltage signals and optionally the input voltage at node 122. In some examples, RC timing elements are used to perform the comparison. To perform switching operations, the power fault monitor 104 monitors voltage thresholds to detect a power fault and/or power converter fault. As shown, the power fault monitor 104 comprises a driver circuit 106 powered by BIAS_2, where the driver circuit 106 directs the switch 108 to close in response to a comparison result from the voltage sense circuit 110 that is associated with a fault trigger. In some examples, the switch 108 is a transistor having a control terminal, a first current terminal, and second current terminal. In this example, the driver circuit 106 provides a control signal to the control terminal of the transistor in response to a comparison result from the voltage sense circuit 110 that is associated with a fault trigger.

In some examples, the fault interrupter signal is asserted by the power fault monitor 104 in response to a fault within the power converter 114 and/or associated circuitry. In one example, the fault interrupter signal 130 triggers a silicon-controlled rectifier (SCR) signal that causes latching contacts of an external circuit to open.

Figure 2:
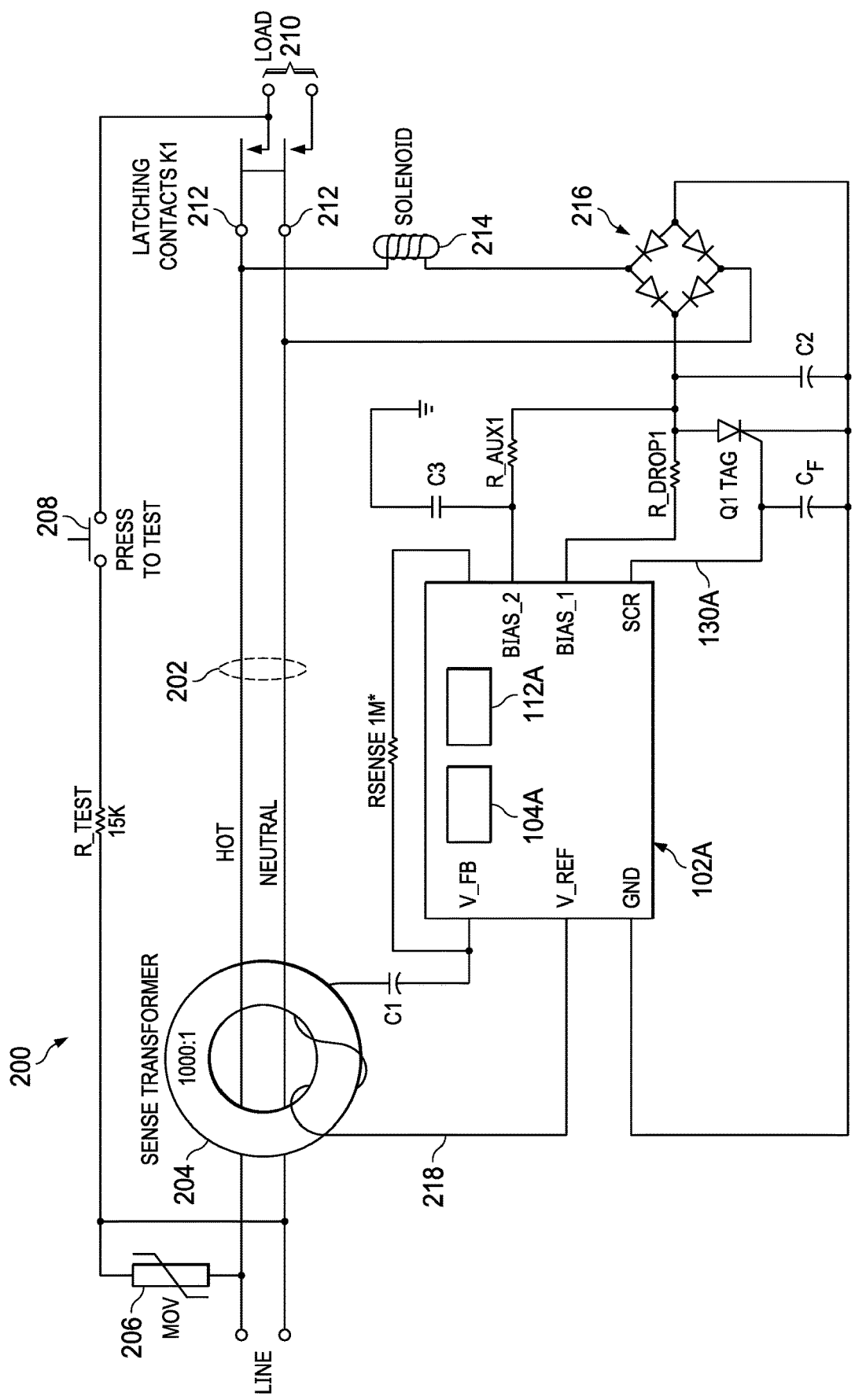
FIG. 2 shows a schematic diagram of a system with a safety fault interrupter circuit in accordance with various examples.

FIG. 2 shows a schematic diagram of a system 200 with a safety fault interrupter circuit 102A in accordance with various examples. In FIG. 2, the safety fault interrupter circuit 102A is an example of the safety fault interrupter circuit 102 of FIG. 1 in a GFCI scenario (the safety fault monitor 112A detects ground faults). As shown, the system 200 shows a power line 202 with "hot" and "neutral" wires. In at least some examples, a metal-oxide varistor (MOV) 206 is coupled between the wires of the power line 202 to provide over-voltage protection. The power line 202 provides power to a load 210 via latching contacts 212.

In FIG. 2, the safety fault interrupter circuit 102A receives sense signals, V_FB and V_REF, from the power line 202 via a sense transformer 204, where a capacitor (C1) is positioned between the sense transformer 204 and a V_FB node of the safety fault interrupter circuit 102A. In the example of FIG. 2, the winding ratio of the sense transformer 204 is 1000:1 (i.e., the sense transformer 204 includes a core with 1000 windings of wire 218 around the core). In other examples, the winding ratio varies to provide a sense signal to the safety fault interrupter circuit 102A via the wire 218. In operation, the safety fault interrupter circuit 102A detects and responds to faults by asserting a fault interrupter signal 130A (e.g., an SCR signal) that causes, for example, a solenoid 214 to open the latching contacts 212. Example faults include real faults, simulated faults, self-test ground faults (using the test button 208), real grounded neutral faults, and simulated grounded neutral faults.

As an example, when a sufficient current imbalance in the wires of the power line 202, a net current flows through the sense transformer 202, causing a magnetic flux to be created. This magnetic flux results in electrical current being induced on the wire 218, which is wound around the sense transformer 204 and is coupled to the V-REF and V_FB nodes of the safety fault interrupter circuit 102A. The induced current on the wire 218 causes a voltage difference at the V-REF and V_FB nodes. When the voltage difference exceeds a predetermined threshold value, the safety fault interrupter circuit 102A asserts a fault interrupter signal 130A (e.g., a SCR signal in FIG. 2) that causes the latching contacts 212 to be opened. In at least some examples, the above-noted fault detection and response scenario is performed by a safety fault monitor 112A (an example of the safety fault monitor 112 in FIG. 1) of the safety fault interrupter circuit 102A, where a first bias voltage (e.g., BIAS_1) is used by the safety fault monitor 112A at least for voltage difference sensing between V_FB and V_REF and for switching operations to assert the fault interrupter signal 130A in response to a trigger. In the example of FIG. 2, BIAS_1 is provided to the safety fault interrupter circuit 102A via a bridge 216, a capacitor (C2), and a resistor (R_DROP1), where these components correspond to a power converter (e.g., the first power converter 114 in FIG. 1).

As represented in FIG. 2, the safety fault interrupter circuit 102A also receives a second bias voltage (e.g., BIAS_2) and includes a power fault monitor 104A (an example of the power fault monitor 104 in FIG. 1). In some examples, the safety fault monitor 112A is a ground fault monitor, while the power fault monitor 104A performs primary or BIAS_1 power loss monitoring. In such examples, BIAS_2 is used to power an internal dedicated circuit as well as to monitor and detect an input voltage fault condition on BIAS_1. In the example of FIG. 2, BIAS_2 is provided to the safety fault interrupter circuit 102A via the bridge 216, a resistor (R_AUX1), and a capacitor (C3), where these components correspond to a power converter (e.g., the second power converter 116 in FIG. 1).

In at least some examples, the power fault monitor 104A asserts a fault interrupter signal 130A (e.g., a SCR signal) that causes the latching contacts 212 to be opened, where BIAS_2 is used by the power fault monitor 104A at least for switching operations to assert the fault interrupter signal 130A in response to a trigger (e.g., a primary input or BIAS_1 power fault condition). In some examples, the power fault monitor 104A uses a comparison result of BIAS_1 and BIAS_2 as a trigger to indicate an imminent primary power fault condition and, in response, to assert the fault interrupter signal 130A. In one example, the power fault monitor 104A asserts the fault interrupter signal 130A when the comparison result indicates that a drop rate of BIAS_1 relative to a drop rate of BIAS_2 voltage exceeds a threshold. In another example, the power fault monitor 104A asserts the fault interrupter signal 130A when the comparison result indicates that the difference between BIAS_1 and BIAS_2 is greater than a threshold amount.

Figure 3:
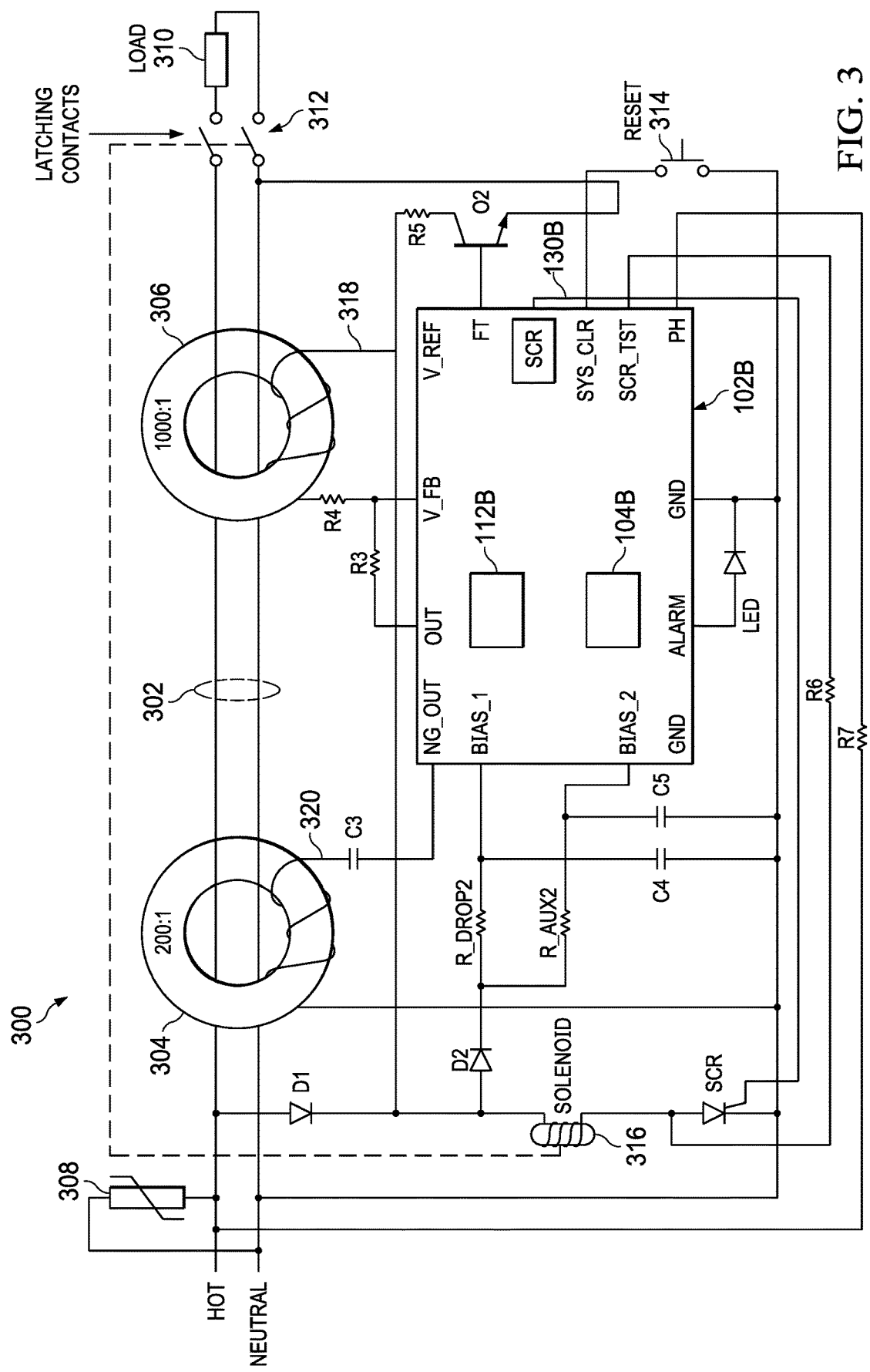
FIG. 3 shows another schematic diagram of a system with a safety fault interrupter circuit in accordance with various examples.

FIG. 3 shows another schematic diagram of a system 300 with a safety fault interrupter circuit 102B in accordance with various examples. In FIG. 3, the safety fault interrupter circuit 102B is an example of the safety fault interrupter circuit 102 of FIG. 1, or the safety fault interrupter circuit 102A of FIG. 2 in another GFCI scenario (the safety fault monitor 112B detects ground faults). As shown, the system 300 shows a power line 302 with "hot" and "neutral" wires. In at least some examples, a varistor 308 is coupled between the wires of the power line 302 to provide over-voltage protection. The power line 302 provides power to a load 310 via latching contacts 312.

In FIG. 3, the safety fault interrupter circuit 102B receives sense signals, V_FB and V_REF, from the power line 302 via a first sense transformer 306, where a voltage divider (formed using resistors, R3 and R4) is positioned between the first sense transformer 306 and a V_FB node of the safety fault interrupter circuit 102B. In the example of FIG. 3, the winding ratio of the first sense transformer 306 is 1000:1 (i.e., the sense transformer 306 includes a core with 1000 windings around the core using a wire 318). In other examples, the winding ratio varies to provide a sense signal to the safety fault interrupter circuit 102B via the wire 318. In operation, the safety fault interrupter circuit 102B detects and responds to faults by asserting a fault interrupter signal 130B (e.g., an SCR signal) that causes a solenoid 316 to open the latching contacts 312. Example faults include real faults, simulated faults, self-test ground faults, real grounded neutral faults, and simulated grounded neutral faults.

As an example, when a sufficient current imbalance in the wires of the power line 302, a net current flows through the first sense transformer 306, causing a magnetic flux to be created. This magnetic flux results in electrical current being induced on a wire 318, which is wound around the first sense transformer 306 and is coupled to the V-REF and V_FB nodes of the safety fault interrupter circuit 102B. The induced current on the wire 218 causes a voltage difference at the V-REF and V_FB nodes. When the voltage difference exceeds a predetermined threshold value, the safety fault interrupter circuit 102B asserts a fault interrupter signal 130B (e.g., a SCR signal in FIG. 2) that causes the latching contacts 312 to be opened.

In at least some examples, the above-noted fault detection and response scenario is performed by a safety fault monitor 112B (an example of the safety fault monitor 112 in FIG. 1, or the safety fault monitor 112A in FIG. 2) of the safety fault interrupter circuit 102B, where a first bias voltage (e.g., BIAS_1) is used by the safety fault monitor 112B at least for switching operations to assert the fault interrupter signal in response to a trigger. The example system 300 of FIG. 3 is similar to the example system 200 of FIG. 2. For the system 300, a second sense transformer 304 is included to enable identification of mis-wire conditions, which could lead to lack of proper protection by the safety fault interrupter circuit 102B. In the example of FIG. 3, the winding ratio of the second sense transformer 304 is 200:1 (i.e., the sense transformer 304 includes a core with 200 windings around the core using a wire 320). In other examples, the winding ratio varies to provide a sense signal to the safety fault interrupter circuit 102B via the wire 320.

The windings formed by the wire 318 have a function similar to the windings formed by the wire 218 described in FIG. 2 (the windings induce a current in the wire 318 proportional to the current along the power line 302), where V_FB is compared to V_REF to identify an induced energy as would occur when a hazardous external current path takes place between Hot and Earth Ground. For the system 300, BIAS_1 is provided to the safety fault interrupter circuit 102B via diodes D1 and D2, a resistor (R_DROP2), and a capacitor (C4), where these components correspond to a power converter (e.g., the first power converter 114 in FIG. 1). In the example of FIG. 3, the second sense transformer 304 is used to identify mis-wiring where NG_OUT and GND are used to induce a signal onto Hot/Neutral wires 302, where a wiring error is identified based on an improper signal coupled back into the first sense transformer 306 and into V_FB respectively. PH and FT in concert with Q2 are used to for self-testing of the protection circuits.

As represented in FIG. 3, the safety fault interrupter circuit 102B also receives a second bias voltage (e.g., BIAS_2) and includes a power fault monitor 104B (an example of the power fault monitor 104 in FIG. 1, or the power fault monitor 104A in FIG. 2). In the example of FIG. 3, BIAS_2 is provided to the safety fault interrupter circuit 102B via D1 and D2, a resistor (R_AUX2), and a capacitor (C5), where these components correspond to a power converter (e.g., the second power converter 116 in FIG. 1).

In at least some examples, the power fault monitor 104B asserts a fault interrupter signal 130B (e.g., a SCR signal) that causes the latching contacts 312 to be opened. In some examples, BIAS_2 is used by the power fault monitor 104B to identify a power fault condition (e.g., a primary or BIAS_1 power fault), and to perform switching operations to assert the fault interrupter signal 130B in response to the fault condition within the circuitry servicing BIAS_1. In some examples, the power fault monitor 104B uses a comparison result of BIAS_1 and BIAS_2 as a trigger to assert the fault interrupter signals. In one example, the power fault monitor 104B asserts the fault interrupter signal 130B when the comparison result indicates that a drop rate of BIAS_1 relative to a drop rate of BIAS_2 voltage exceeds a threshold. In another example, the power fault monitor 104B asserts the fault interrupter signal 130B when the comparison result indicates that the difference between BIAS_1 and BIAS_2 is greater than a threshold amount.

Also represented for the system 300 of FIG. 3 is a reset button 314 coupled to a reset node (SYS_CLR) of the safety fault interrupter circuit 102B to reset fault monitoring operations as desired. The safety fault interrupter circuit 102B also includes an alarm node that couples to a light-emitting diode (LED) and/or other messaging components to broadcast when the safety fault interrupter circuit 102B is not operating correctly.

Figure 4:
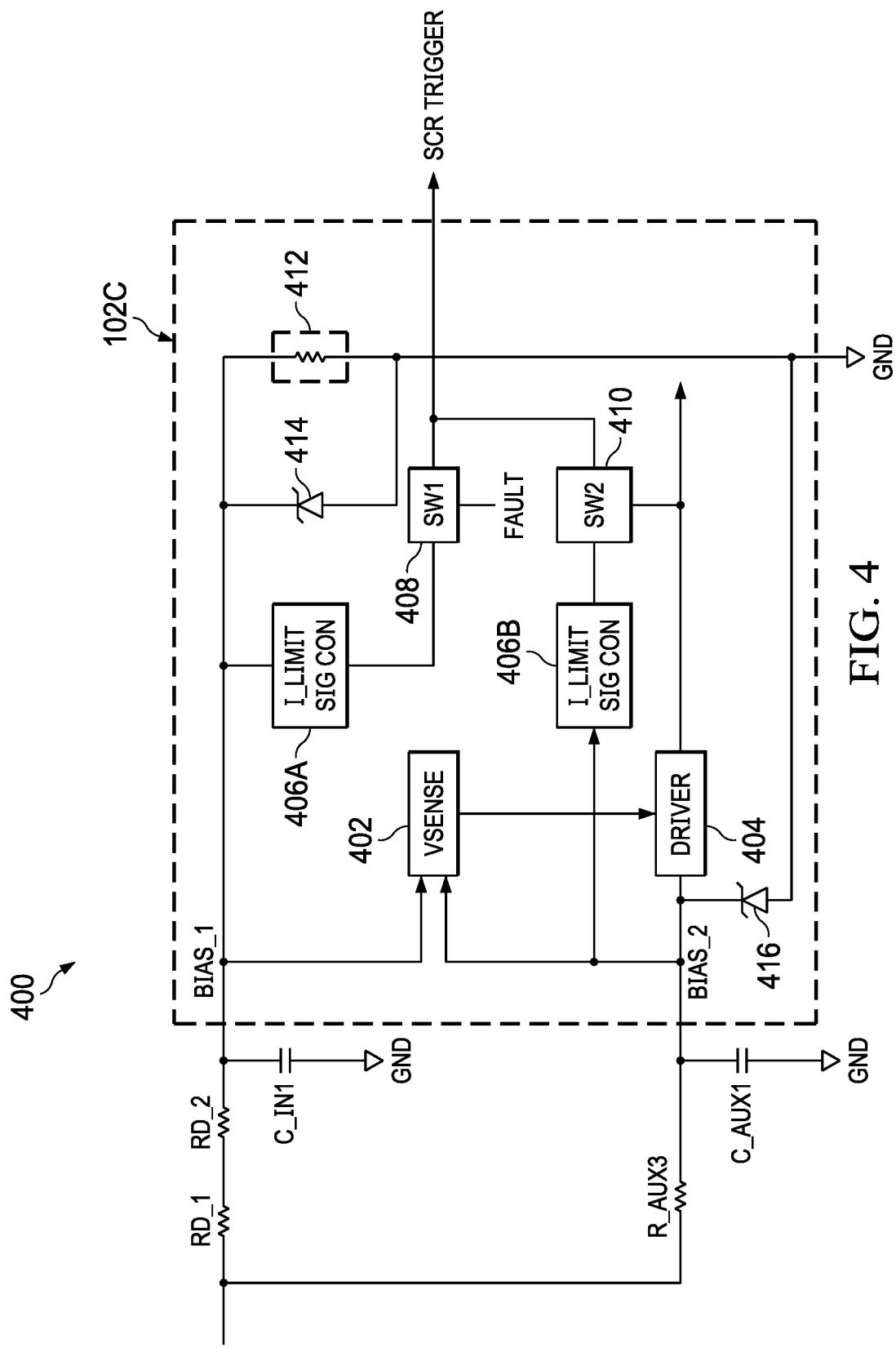
FIG. 4 shows a schematic diagram of a safety fault monitoring scenario, where various internal components of a safety fault interrupter circuit are represented in accordance with various examples.

FIG. 4 shows a schematic diagram of a safety fault monitoring scenario 400, where various internal components of a safety fault interrupter circuit 102C are represented in accordance with various examples. In FIG. 4, the safety fault interrupter circuit 102C is an example of the safety fault interrupter circuit 102 of FIG. 1, the safety fault interrupter circuit 102A of FIG. 2, or the safety fault interrupter circuit 102B of FIG. 3). In some examples, the safety fault interrupter circuit 102C has a safety fault monitor (now shown) configured to detect ground faults. In other examples, the safety fault interrupter circuit 102C has a safety fault monitor (not shown) configured to detect arc faults.

As represented in FIG. 4, the safety fault interrupter circuit 102C includes a resistive load 412 and shunt regulator 414 coupled between the resistive load 412 and a ground node. The shunt regulator 414 provides internal voltage regulation to the internal circuitry represented by resistive load 412, which represents fault monitor components (e.g., components of the safety fault monitor 112 in FIG. 1) that operate using BIAS_1. In one example, the voltage sensing described earlier in FIG. 2, the safety fault interrupter circuit 102C performs the operations described for safety fault interrupter circuit 102A, where V_FB and V_REF are used to identify a current fault or wiring fault, and where switching operations related to the resistive load 412 are powered by BIAS_1 to assert a fault interrupter signal in response to a trigger (e.g., a current fault or a wiring fault).

In FIG. 4, BIAS_1 is provided to the safety fault interrupter circuit 102C via two resistors, RD_1 and RD_2 (an example of R_DROP1 in FIG. 2 and R_DROP2 in FIG. 3), and a capacitor, C_IN1 (an example of C2 in FIG. 2, or C4 in FIG. 3). RD_1 and RD_2 are redundant resistor elements in order to meet respective safety requirements, which demand a safe condition after a single component failure (in this case a shorted or open circuit component). In the example of FIG. 4, RD1, RD2, and C_IN1 are components of a power converter (e.g., the first power converter 114 in FIG. 1) to provide BIAS_1 to the safety fault interrupter circuit 102C. In some examples, safety fault monitor components represented by the resistive load 412 use BIAS_1 for ground fault detection (e.g., electrocution and/or wiring fault detection), and for switching operations such that a detected fault results in a switch 408 (labeled "SW1") being closed to assert a fault interrupter signal. In other examples, the safety fault monitor components represented by the resistive load 412 use BIAS_1 for arc fault detection.

The safety fault interrupter circuit 102C also includes a voltage sense circuit 402 (an example of the voltage sense circuit 110 in FIG. 1) coupled to a driver circuit 404 (an example of the driver circuit 106 in FIG. 1), where the driver circuit 404 uses BIAS_2 to selectively operate a switch 410 (labeled "SW2") based on comparison results determined by the voltage sense circuit 402. In FIG. 4, BIAS_2 is provided to the safety fault interrupter circuit 102C via R_AUX3 (an example of R_AUX1 in FIG. 2 and R_AUX2 in FIG. 3) and a capacitor, C_AUX1 (an example of C3 in FIG. 2, or C5 in FIG. 3). In the example of FIG. 4, R_AUX3 and C_AUX1 are part of a power converter (e.g., the second power converter 116 in FIG. 1) to provide BIAS_2 to the safety fault interrupter circuit 102C.

In at least some examples, a shunt regulator 416 is placed between the BIAS_2 input of the driver circuit 404 and a ground node to provide dedicated voltage regulation to the circuitry used to detect a primary or BIAS_1 power fault condition, and to operate the voltage sense circuit 402, the driver circuitry 404, and the switch 410 to de-energize a load when a primary or BIAS_1 power fault occurs (e.g., if RD_1 or RD_2 fail in an open circuit condition). In the example of FIG. 4, the voltage sensor circuit 402, the driver circuit 404, and switch 410 correspond to a power fault monitor (e.g., the power fault monitor 104 of FIG. 1, the power fault monitor 104A of FIG. 2, or the power fault monitor 104B of FIG. 3) for the safety fault interrupter circuit 102C, where BIAS_2 provides power to the voltage sense circuit 402, the driver circuitry 404, and the switch 410 to assert a fault interrupter signal in response to a trigger (e.g., a primary or BIAS_1 power fault)

In some examples, the driver circuit 404 causes the switch 410 to close (asserting a fault interrupter signal, such as an SCR signal) when the comparison result indicates that a drop rate of BIAS_1 relative to a drop rate of BIAS_2 voltage exceeds a predetermined threshold. In different examples, the threshold varies depending on the specific implementation for a given IC and associated external circuitry. In some examples, the driver circuit 404 causes the switch 410 to close (asserting a fault interrupter signal, such as an SCR signal) when the comparison result indicates that the difference between BIAS_1 and BIAS_2 is more than a threshold amount or BIAS_1 changes relative to BIAS_2 at a rate greater than a threshold.

In FIG. 4, blocks 406A and 406B (labeled "I_LIMIT and SIG CON") are used to control and condition the power signals used to trigger respective actuators for de-energizing power to a load. In one example (see FIG. 2), the trigger signal described as SCR is used to trip an SCR switch (Q1), which result in a low impedance across bridge rectifier 216 and engagement of the solenoid 214 to open the latching contacts 212.

In an example scenario, the resistive load 412 represents ground fault (e.g., electrocution and/or mis-wiring fault) monitoring components within the IC. In another example scenario, the resistive load 412 represents arc fault monitoring components within the IC. In some examples, the resistive load 412 needs up to 20 mW to properly power the associated internal circuitry with an example minimum voltage requirement of 6V. In some examples, the internal shunt regulator 414 is set to 12V, depending on the specific IC implementation. In this example, the necessary current passing through the resistive load 412 is calculated as 6V/0.02 W=3 mA. Also, the resistive load 412, representing a safety fault monitor, is calculated with $R=P/I^2=2.2$ kΩ.

To support a safety fault interrupter circuit 102C for the above-noted power specifications, the values for RD_1 and RD_2 are selected to supply a minimum input voltage of 6V. If, as an example, 90 VDC is assumed as the minimum, the combined value for RD_1 and RD_2 is (90 VDC–6 VDC)/3.0 mA=28 kΩ. In one example, RD_1 and RD_2 are selected to have a combined value of approximately 28 kΩ (e.g., RD_1=RD_2=13.5 kΩ, where rounding down by 1 kΩ total (500 ohm each) in order to accommodate component tolerance. Now sizing RD_1 and RD_2 for an overvoltage scenario (e.g., 240 VAC), a value of (339V–12V)/27 K=12.1 mA. In this example the losses for RD_1 and RD_2 are approximated to be 1.98 Watts each. Accordingly, RD_1 and RD_2 are sized as 2 W components. Assuming BIAS_2 load circuitry 404, 406B, 410 requires 150 uA to operate properly, and a minimum of 90 VAC for this example scenario, an R_AUX3 value of 760 kΩ is appropriate (with a loss of 148 mW during a 240 VAC overvoltage scenario), where R_AUX3 is implemented as a 0402 or 0603 size resistor. Also for this example scenario, a no power-fault example magnitude for BIAS_1 is 6V, and an example no power-fault magnitude for BIAS_2 is 6V, where timing/storage capacitors, C_IN1 and C_AUX1, are chosen to ensure the circuitry powered by BIAS_2 maintains proper operation after the magnitude of BIAS_1 is below a predetermined threshold. As an example, BIAS_2 should allow proper operation of the driver 404 and the switch 410 to create the trigger signal used to eventually de-energize the load. In other examples, the component values, the BIAS_1 value, and the BIAS_2 vary from the example values given. Such variance could be due to supporting different safety fault detection options and power fault monitor options as described herein.

Regardless of the particular faults being supported by BIAS_1, the low power circuitry associated with BIAS_2 enables BIAS_1 to be monitored. The circuitry needed to monitor BIAS_1 has low power consumption and thus requires little current. Thus, in some examples, resistors with small size, low-cost, and high-resistance are used for the auxiliary resistance (e.g., R_AUX1-R_AUX5 in FIGS. 2-5B) that enables monitoring of BIAS_1 in contrast to the drop resistors used to provide BIAS_1 (e.g., R_DROP1 in FIG. 2, R_DROP2 in FIG. 3, and RD_1 and RD_2 in FIG. 4). In some examples, using a power fault monitor as described herein (e.g., the power fault monitor 104 in FIG. 1, the power fault monitor 104A in FIG. 2A, the power fault monitor 104B in FIG. 3, or respective components in FIG. 4) enables the number of drop resistors used to provide BIAS_1 to be reduced from four to two, which significantly reduces the footprint and power consumption of components needed to support an IC with a safety fault monitor as described herein (e.g., the safety fault monitor 112 in FIG. 1, the safety fault monitor 112A in FIG. 2A, the safety fault monitor 112 in FIG. 3, or respective components in FIG. 4).

Figure 5A:
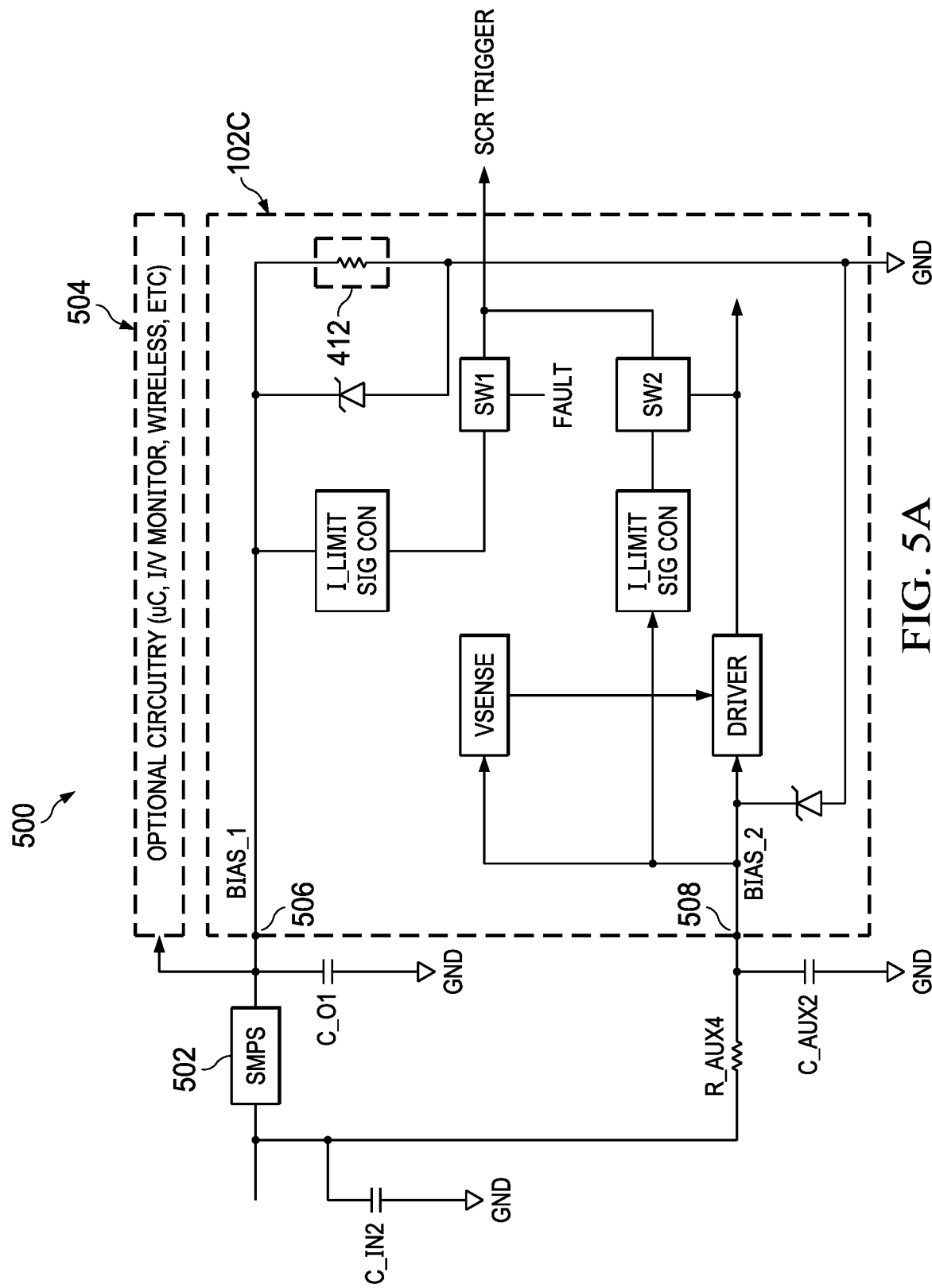
FIGS. 5A and 5B show schematic diagrams of safety fault monitoring scenarios, where various internal components of a safety fault interrupter circuit are represented in accordance with various examples.

FIG. 5A shows a schematic diagram of a safety fault monitoring scenario 500, where various internal components of the safety fault interrupter circuit 102C are represented in accordance with various examples. In the fault monitoring scenario 500, the same safety fault interrupter circuit 102C represented in FIG. 4 is presented. The difference between the safety fault monitoring scenario 400 of FIG. 4 and the safety fault monitoring scenario 500 of FIG. 5 is that an SMPS 502 is used to provide BIAS_1. In some examples, a capacitor, C_IN2, couples between an input-side of the SMPS 502 and a ground node. In addition, another capacitor, C_O1, couples between an output-side of the SMPS 502 and a ground node (e.g., C_O1 couples between a BIAS_1 node 506 of the safety fault interrupter circuit 102C and a ground node). As represented in FIG. 5A, in addition to providing BIAS_1 to the safety fault interrupter circuit 102C, the SMPS 502 also supports optional circuitry 504, such as microprocessors, voltage/current monitors, wireless communication components, and/or other components to support "smart" fault monitoring and interrupt operations.

For scenario 500, the operations of the safety fault interrupter circuit 102C of FIG. 5A follow the discussion provided for the scenario 400 of FIG. 4, where BIAS_1 is provided by the SMPS 502. As desired, the values for RD1, RD2, C_IN1, C_AUX1, and R_AUX1 in FIG. 4 are selected to support particular power consumption values and/or no power-fault magnitudes for BIAS_1 and BIAS_2 and/or to support other operations (e.g., how quickly BIAS_1 and BIAS_2 change in response to brown-outs, black-outs, and/or other fault conditions). Similarly, the values for C_O1, C_IN2, R_AUX4, C_AUX2 in FIG. 5A are selected to support particular power consumption values, particular no power-fault magnitudes for BIAS_1 and BIAS_2, and/or to other operations (e.g., how quickly BIAS_1 and BIAS_2 change in response to brown-outs, black-outs, and/or other power fault conditions).

Figure 5B:
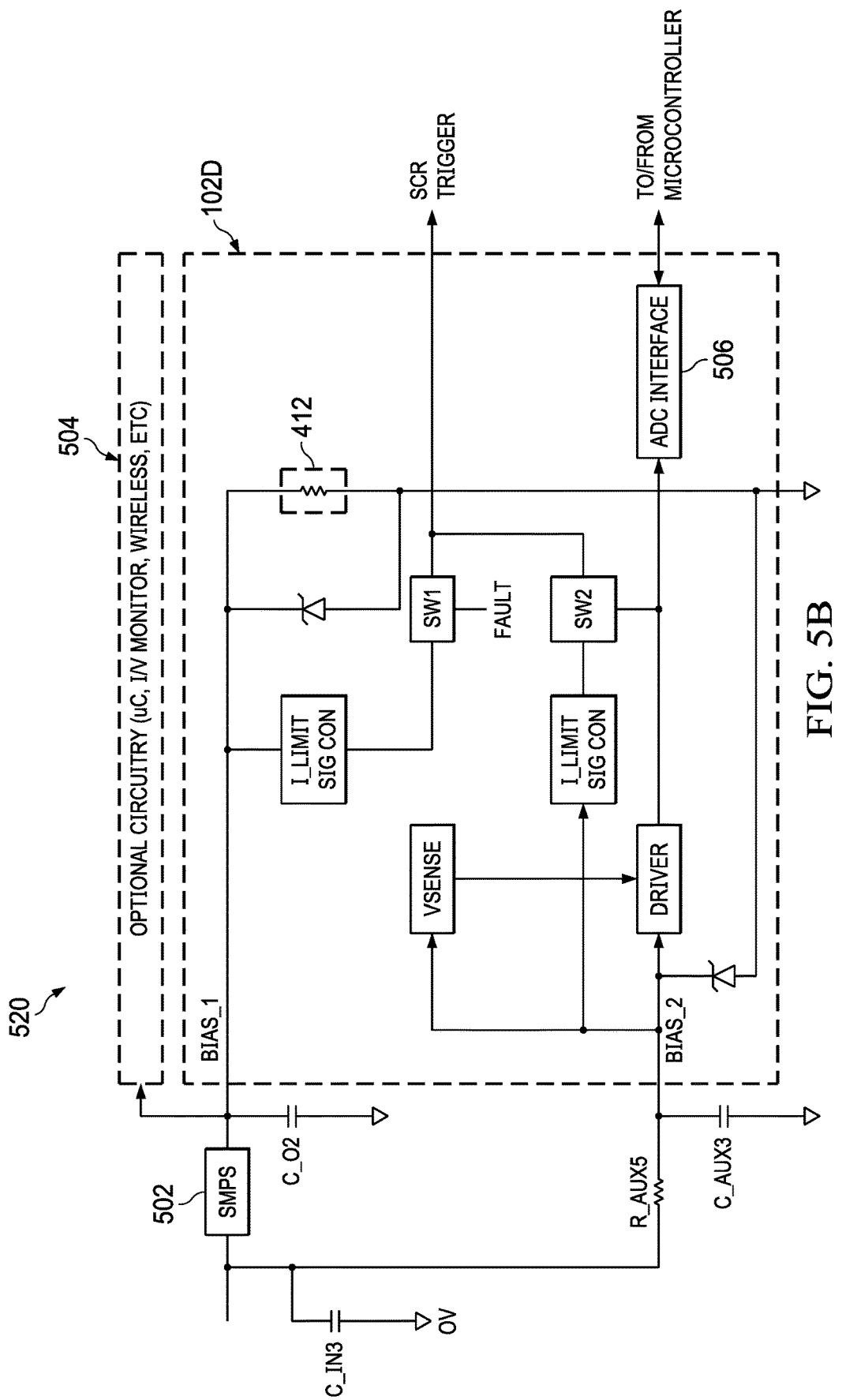

FIG. 5B shows a schematic diagram of another safety fault monitoring scenario 520, where various internal components of a safety fault interrupter circuit 102D are represented in accordance with various examples. In the fault monitoring scenario 520, the safety fault interrupter circuit 102D is the same as the safety fault interrupter circuit 102C represented in FIGS. 4 and 5A, except that the safety fault interrupter circuit 102D includes analog-to-digital converter (ADC) and interface block 506. The ADC/interface block 506 enables the safety fault interrupter circuit 102D to communicate with the optional circuitry 504 introduced in FIG. 5A to support "smart" fault monitoring and interrupt operations. In at least some examples, BIAS_2 powers the ADC/interface block 506 as represented in FIG. 5B.

In some examples, the various components external to the safety fault interrupter circuit 102D (e.g., C_O2, C_IN3, R_AUX5, C_AUX3) in scenario 520 are the same components introduced in scenario 500 (e.g., C_O2=C_O1, C_IN3=C_IN2, R_AUX5=R_AUX4, C_AUX3=C_AUX2). In other examples, the values for the external component in FIGS. 5A and 5B are adjusted to account for the ADC/interface 506, the optional circuitry 504, and/or other system components.

The safety fault interrupter circuits described herein (e.g., the safety fault interrupter circuit 102 in FIG. 1, the safety fault interrupter circuit 102A in FIG. 2, the safety fault interrupter circuit 102B in FIG. 3, the safety fault interrupter circuit 102C in FIGS. 4 and 5A, and the safety fault interrupter circuit 102D in FIG. 5B) provide the benefit of reducing the overall footprint and cost of components needed to support IC biasing. This is because there are low current requirements for BIAS_2 in order to perform the voltage sensing operations (see e.g., the description for the voltage sensing circuit 110 in FIG. 1) and to trigger a dedicated fault circuit when a power fault condition is identified. In one example, the use of large resistors needed to support an existing safety fault interrupter circuit with a single biasing node, is reduced from four resistors (at least 2 W each) to two resistors (less than 2 W each). While an additional small 0402/0602 resistor (one of R_AUX1-R_AUX5) and capacitor (one of C3, C5, or C_AUX1-C_AUX3) is used, the overall footprint of external components to support BIAS_1 and BIAS_2 is reduced compared to an existing safety fault interrupter circuit with a single bias node. In addition, fault monitoring based on BIAS_2 enables early power loss indication and triggering of a fault interrupter signal (e.g., an SCR signal) to disconnect an AC load based on a new fault condition.

For scenarios involving SMPS, fault monitoring based on BIAS_2 is used to identify when the SMPS stage has failed and to respond by de-energizing the AC load before power is totally lost. As desired, in some examples, the early indication of an SMPS fault and/or power loss is used by optional circuitry (e.g., circuitry 504 in FIGS. 5A and 5B) to notify host elements (e.g., a network or user) of an imminent fault condition. In this example, the ADC/interface block 506 digitizes signals as needed and uses bus standards (e.g., I2C or SPI) to communicate with microcontrollers and/or microprocessors performing "smart" fault monitoring and response operations.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An apparatus comprising:
a first power converter circuit having an input configured to receive an alternating current (AC) voltage and having a first bias output, wherein the first bias output provides a first direct current (DC) voltage;
a second power converter circuit having an input configured to receive the alternating current (AC) voltage and having a second bias output, wherein the second bias output provides a second direct current (DC) voltage;
a safety fault monitor circuit having an input wherein the input receives the first DC voltage and having an output coupled to a fault interrupt output, the safety fault monitor being configured to selectively assert a fault interrupter signal on the fault interrupt output based at least in part on the first DC voltage and a first power consumption; and
a power fault monitor circuit having a first input wherein the first input receives the second DC voltage, having a second input wherein the second input receives the first DC voltage, and having an output coupled to the fault interrupt output, the power fault monitor being configured to selectively assert the fault interrupter signal on the fault interrupt output based at least in part on the second DC voltage and a second power consumption, in which the second power consumption is less than the first power consumption.

2. The apparatus of claim 1, in which the power fault monitor circuit includes a voltage sense circuit configured to compare the first DC voltage and the second DC voltage, and to determine a comparison result, and the power fault monitor circuit is configured to selectively assert the fault interrupter signal based on the comparison result.

3. The apparatus of claim 2, in which the fault interrupter signal is asserted by the power fault monitor circuit when the comparison result indicates that a drop rate of the first DC voltage relative to a drop rate of the second DC voltage exceeds a threshold.

4. The apparatus of claim 2, in which the fault interrupter signal is asserted by the power fault monitor when the comparison result indicates that the difference between the first and second DC voltages is greater than a threshold amount.

5. The apparatus of claim 2, in which the power fault monitor circuit includes:
a driver circuit coupled to the voltage sense circuit; and
a switch coupled to the driver circuit, in which the driver circuit is configured to assert a control signal to the switch based on the comparison result, in which the switch is configured to allow current flow in response to an asserted control signal from the driver circuit, and in which the current flow results in the fault interrupter signal.

6. The apparatus of claim 1, in which the safety fault monitor circuit is configured to detect ground faults.

7. The apparatus of claim 1, in which the safety fault monitor circuit is configured to detect arc faults.

8. The apparatus of claim 1, including an analog-to-digital signal converter (ADC) coupled to the fault interrupt output and configured to convert fault interrupt signals into digital signals for use by a microprocessor.

9. The apparatus of claim 1, in which the safety fault monitor circuit is a ground fault circuit interrupter (GFCI), and the fault interrupter signal is a silicon-controlled rectifier (SCR) signal.

10. An integrated circuit that comprises:
a safety fault monitor circuit having a feedback input, a reference input, a first bias input configured to receive a first DC voltage wherein the first DC voltage is derived form an AC voltage and a silicon controlled rectifier output, the safety fault monitor circuit being configured to selectively assert a fault interrupter signal on the silicon controlled rectifier output; and
a power fault monitor circuit coupled to the first bias input, the second bias input, and the silicon controlled rectifier output, for the safety fault monitor circuit, wherein the power fault monitor circuit is configured to selectively assert the fault interrupter signal on the silicon controlled rectifier output, and the power fault monitor circuit includes:
a voltage sense circuit configured to compare the first DC voltage on the first bias input and the second DC voltage on the second bias input, and to determine a comparison result; and
a switch operated based on the comparison result.

11. The integrated circuit of claim 10, in which the first DC voltage is input to the safety fault monitor circuit, in which the second DC voltage is input to the power fault monitor circuit, and in which a power consumption of the power fault monitor circuit is less than a power consumption of the safety fault monitor circuit.

12. The integrated circuit of claim 10, in which the power fault monitor circuit includes a driver circuit coupled to the voltage sensor circuit, the driver circuit is configured to assert a control signal to the switch based on the comparison result, the switch is configured to allow current flow in response to an asserted control signal from the driver circuit, and the current flow results in the fault interrupter signal.

13. The integrated circuit of claim 10, in which:
the first voltage is provided from a switch-mode power supply (SMPS), and the second voltage is provided via a resistor-capacitor (RC) circuit coupled to an input side of the SMPS.

14. The integrated circuit of claim 10, including:
the first voltage is provided from a first resistor-capacitor (RC) circuit, and the second voltage is provided via a second RC circuit coupled to an input side of the first RC circuit.

\* \* \* \* \*